United States Patent
Manickam et al.

(10) Patent No.: US 7,545,514 B2
(45) Date of Patent: Jun. 9, 2009

(54) PICK AND PLACE MACHINE WITH IMPROVED COMPONENT PICK IMAGE PROCESSING

(75) Inventors: Swaminathan Manickam, Bellingham, MA (US); John P. Konicek, Minneapolis, MN (US); David W. Duquette, Minneapolis, MN (US); Steven K. Case, St. Louis Park, MN (US)

(73) Assignee: CyberOptics Corporation, Golden Valley, MN (US)

( * ) Notice: Subject to any disclaimer, the term of this patent is extended or adjusted under 35 U.S.C. 154(b) by 273 days.

(21) Appl. No.: 11/521,066

(22) Filed: Sep. 14, 2006

(65) Prior Publication Data

US 2007/0091323 A1    Apr. 26, 2007

Related U.S. Application Data

(60) Provisional application No. 60/717,127, filed on Sep. 14, 2005.

(51) Int. Cl.
  G01B 11/30 (2006.01)
  G01B 11/14 (2006.01)
  G01B 11/04 (2006.01)
  G01B 11/08 (2006.01)

(52) U.S. Cl. ............... 356/601; 356/614; 356/622; 356/638

(58) Field of Classification Search .......... 356/246, 356/335–343, 432, 394; 422/68.1, 102; 29/720, 29/740; 382/141–152; 430/5, 126
See application file for complete search history.

(56) References Cited

U.S. PATENT DOCUMENTS

| | | | |
|---|---|---|---|
| 3,814,845 A | 6/1974 | Hurlbrink, III et al. | 178/6.8 |
| 4,281,342 A | 7/1981 | Ueda et al. | 348/94 |
| 4,776,088 A * | 10/1988 | Biggs et al. | 29/834 |
| 4,809,430 A | 3/1989 | Maryuama et al. | 29/834 |
| 4,825,091 A | 4/1989 | Breyer et al. | 250/559.38 |
| 4,914,513 A | 4/1990 | Spigarelli et al. | 358/101 |
| 4,978,224 A | 12/1990 | Kishimoto et al. | 356/394 |
| 4,989,082 A | 1/1991 | Hopkins | 358/101 |
| 4,999,785 A | 3/1991 | Schmuter | 364/507 |

(Continued)

FOREIGN PATENT DOCUMENTS

EP    0 664 666 B1    8/1997

(Continued)

OTHER PUBLICATIONS

International Search Report and Written Opinion from application No. PCT/US2006/035954 filed Sep. 14, 2006.

(Continued)

*Primary Examiner*—L. G Lauchman
*Assistant Examiner*—Jarreas C Underwood
(74) *Attorney, Agent, or Firm*—Christopher R. Christenson; Westman, Champlin & Kelly, P.A.

(57) ABSTRACT

A pick and place machine includes a sensor disposed to acquire an image of a nozzle before a pick operation, and one or more images after the pick operation. Image analytics based upon these images reveal important characteristics that can be used to classify the pick operation. In some embodiments, a plurality of after-pick images are acquired at different poses (angular orientations).

31 Claims, 23 Drawing Sheets

U.S. PATENT DOCUMENTS

| | | | | |
|---|---|---|---|---|
| 5,003,692 | A | 4/1991 | Izumi et al. | 29/834 |
| 5,023,916 | A | 6/1991 | Breu | 382/8 |
| 5,060,366 | A | 10/1991 | Asai et al. | 29/739 |
| 5,105,149 | A | 4/1992 | Tokura | 324/158 |
| 5,129,725 | A | 7/1992 | Ishizuka et al. | 356/617 |
| 5,134,665 | A | 7/1992 | Jyoko | 382/8 |
| 5,194,791 | A | 3/1993 | Cull | 318/568.1 |
| 5,235,316 | A | 8/1993 | Qualizza | 340/436 |
| 5,237,622 | A | 8/1993 | Howell | 382/8 |
| 5,249,349 | A | 10/1993 | Kuinose et al. | 29/721 |
| 5,278,634 | A * | 1/1994 | Skunes et al. | 356/400 |
| 5,298,977 | A | 3/1994 | Shintani et al. | 356/376 |
| 5,336,935 | A | 8/1994 | Shitanda et al. | 307/116 |
| 5,377,405 | A | 1/1995 | Sakurai et al. | 29/833 |
| 5,383,270 | A | 1/1995 | Iwatsuka et al. | 29/840 |
| 5,384,956 | A * | 1/1995 | Sakurai et al. | 29/834 |
| 5,392,360 | A | 2/1995 | Weindelmayer et al. | 382/8 |
| 5,450,204 | A | 9/1995 | Shigeyama et al. | 356/604 |
| 5,461,480 | A | 10/1995 | Yamada et al. | 256/394 |
| 5,467,186 | A | 11/1995 | Indo et al. | 356/150 |
| 5,471,310 | A | 11/1995 | Spigarelli et al. | 356/399 |
| 5,495,424 | A | 2/1996 | Tokura | |
| 5,541,834 | A | 7/1996 | Tomigashi et al. | 364/167.01 |
| 5,550,583 | A | 8/1996 | Amir et al. | 348/126 |
| 5,566,447 | A | 10/1996 | Sakurai | 294/832 |
| 5,589,942 | A | 12/1996 | Gordon | 356/611 |
| 5,598,345 | A | 1/1997 | Takura | 364/489 |
| 5,619,328 | A | 4/1997 | Sakurai | 356/375 |
| 5,627,913 | A | 5/1997 | Spigarelli et al. | 382/151 |
| 5,660,519 | A | 8/1997 | Ohta et al. | 414/783 |
| 5,686,994 | A | 11/1997 | Tokura | 356/394 |
| 5,719,952 | A | 2/1998 | Rooks | 382/150 |
| 5,724,722 | A | 3/1998 | Hashimoto | 29/740 |
| 5,739,846 | A | 4/1998 | Gieskes | 348/87 |
| 5,745,241 | A | 4/1998 | Hashimoto | 356/384 |
| 5,749,142 | A | 5/1998 | Hanamura | 29/833 |
| 5,754,677 | A | 5/1998 | Kawada | 382/141 |
| 5,835,133 | A | 11/1998 | Moreton et al. | 348/49 |
| 5,839,186 | A | 11/1998 | Onodera | 29/720 |
| 5,878,151 | A | 3/1999 | Tang et al. | 382/103 |
| 5,900,940 | A | 5/1999 | Aoshima | 356/375 |
| 5,903,353 | A | 5/1999 | Raymond | 356/620 |
| 5,908,282 | A | 6/1999 | Onodea | 414/783 |
| 5,912,984 | A | 6/1999 | Michael et al. | 382/149 |
| 5,949,681 | A | 9/1999 | Asai et al. | 700/113 |
| 5,956,149 | A | 9/1999 | Suzuki et al. | 356/375 |
| 5,969,820 | A | 10/1999 | Yoshi et al. | 356/375 |
| 5,982,927 | A | 11/1999 | Koljonen | 382/168 |
| 6,027,019 | A | 2/2000 | Kou | 235/375 |
| 6,047,084 | A | 4/2000 | Kent et al. | 382/147 |
| 6,195,165 | B1 * | 2/2001 | Sayegh | 356/613 |
| 6,198,529 | B1 | 3/2001 | Clark et al. | 356/237.5 |
| 6,223,425 | B1 | 5/2001 | Asai et al. | 29/740 |
| 6,286,202 | B1 | 9/2001 | Asai et al. | 39/740 |
| 6,317,972 | B1 | 11/2001 | Asai et al. | 29/833 |
| 6,332,536 | B2 | 12/2001 | Easton | 206/459.5 |
| 6,334,840 | B1 | 1/2002 | Asai et al. | 483/1 |
| 6,408,090 | B1 | 6/2002 | Salomon et al. | 382/145 |
| 6,478,533 | B2 * | 11/2002 | Davis, III | 414/816 |
| 6,506,614 | B1 | 1/2003 | Strassmann | 438/7 |
| 6,538,244 | B1 | 3/2003 | Skunes | 250/208.1 |
| 6,549,647 | B1 | 4/2003 | Skunes et al. | 382/150 |
| 6,583,884 | B2 * | 6/2003 | Rudd et al. | 356/601 |
| 6,616,263 | B2 | 9/2003 | Allen et al. | 347/19 |
| 6,622,054 | B1 | 9/2003 | Okuda et al. | 700/51 |
| 6,681,151 | B1 | 1/2004 | Weinzimmer et al. | 700/259 |
| 6,738,505 | B1 | 5/2004 | Prince | 382/150 |
| 6,744,499 | B2 * | 6/2004 | Skunes et al. | 356/243.1 |
| 6,748,649 | B2 | 6/2004 | Okuda et al. | 29/740 |
| 6,762,847 | B2 * | 7/2004 | Duquette et al. | 356/614 |
| 6,778,878 | B1 | 8/2004 | Kou | 700/221 |
| 6,801,652 | B1 | 10/2004 | Stanzi et al. | 382/147 |
| 6,807,725 | B2 | 10/2004 | Asai et al. | 29/740 |
| 6,891,967 | B2 | 5/2005 | Prince | 382/150 |
| 6,966,235 | B1 | 11/2005 | Paton | 73/865.9 |
| 7,029,224 | B2 * | 4/2006 | Kubo et al. | 414/680 |
| 7,083,082 | B2 | 8/2006 | Byskov et al. | 235/375 |
| 7,239,399 | B2 * | 7/2007 | Duquette et al. | 356/614 |
| 2001/0040117 | A1 | 11/2001 | Easton | 206/714 |
| 2002/0014003 | A1 | 2/2002 | Asai et al. | 29/740 |
| 2002/0031279 | A1 * | 3/2002 | Shimizu | 382/291 |
| 2002/0053133 | A1 | 5/2002 | Suhara et al. | 29/700 |
| 2002/0069395 | A1 | 6/2002 | Fujiwara et al. | 716/4 |
| 2002/0078580 | A1 | 6/2002 | Haugen et al. | 33/533 |
| 2002/0099466 | A1 | 7/2002 | Diggin et al. | 700/121 |
| 2002/0112064 | A1 | 8/2002 | Eastvold | 709/230 |
| 2002/0124391 | A1 | 9/2002 | Kawai et al. | 29/739 |
| 2002/0133940 | A1 | 9/2002 | Kadomatsu et al. | 29/832 |
| 2002/0143423 | A1 | 10/2002 | Huber et al. | 700/121 |
| 2003/0027363 | A1 | 2/2003 | Kodama | 438/14 |
| 2003/0029033 | A1 | 2/2003 | Hidese et al. | 29/833 |
| 2003/0098426 | A1 | 5/2003 | Hayata | 250/559.34 |
| 2003/0110610 | A1 | 6/2003 | Duquette et al. | 29/407.09 |
| 2003/0111494 | A1 * | 6/2003 | Lin et al. | 222/505 |
| 2003/0159515 | A1 | 8/2003 | Tonomura | 73/584 |
| 2003/0219330 | A1 | 11/2003 | Lyndaker et al. | 414/411 |
| 2003/0225547 | A1 | 12/2003 | Paradies | 702/150 |
| 2004/0094594 | A1 | 5/2004 | Liebeke | 226/32 |
| 2004/0119987 | A1 * | 6/2004 | Madsen et al. | 356/614 |
| 2004/0163243 | A1 | 8/2004 | Noda et al. | 29/834 |
| 2004/0186616 | A1 | 9/2004 | Overman et al. | 700/224 |
| 2005/0115060 | A1 | 6/2005 | Kondo | 29/650 |
| 2005/0117797 | A1 | 6/2005 | Gaida | 382/153 |
| 2005/0123187 | A1 | 6/2005 | Bushman et al. | 382/141 |
| 2005/0125993 | A1 | 6/2005 | Madsen et al. | 29/739 |
| 2005/0161498 | A1 | 7/2005 | Byskov et al. | 235/376 |
| 2005/0210832 | A1 | 9/2005 | Tassin et al. | 53/396 |
| 2005/0268460 | A1 | 12/2005 | Case | 29/833 |
| 2005/0276464 | A1 | 12/2005 | Duquette et al. | 382/151 |
| 2006/0016066 | A1 | 1/2006 | Gaida et al. | 29/740 |
| 2006/0075631 | A1 | 4/2006 | Case et al. | 29/709 |
| 2006/0174480 | A1 | 8/2006 | Kawada | 29/833 |

FOREIGN PATENT DOCUMENTS

| | | |
|---|---|---|
| EP | 0 948 250 | 10/1999 |
| EP | 0 959 654 | 11/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 01309190 | 12/1989 |
| JP | 02076080 | 3/1990 |
| JP | 02235399 | 9/1990 |
| JP | 5-37918 | 2/1993 |
| JP | 6-249629 | 9/1994 |
| JP | 6-249630 | 9/1994 |
| JP | 6-310899 | 11/1994 |
| JP | 07183697 | 7/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 11285925 | 1/1999 |
| JP | 9-293998 | 9/1999 |

| | | |
|---|---|---|
| JP | 2000-022392 | 1/2000 |
| JP | 2000349499 A | 12/2000 |
| JP | 2001-165860 | 6/2001 |
| JP | 2001-168600 | 6/2001 |
| JP | 2001168594 | 6/2001 |
| JP | 2002271099 | 9/2002 |
| JP | 2003-092495 | 3/2003 |
| JP | 2003152392 | 5/2003 |
| JP | 2003-243898 | 8/2003 |
| JP | 2003243899 | 8/2003 |
| JP | 2003-304095 | 10/2003 |
| JP | 2005285840 | 10/2005 |
| WO | 0 932 331 A1 | 7/1999 |
| WO | WO 99/49713 | 9/1999 |
| WO | WO 00/19794 | 4/2000 |
| WO | WO 00/19800 | 4/2000 |
| WO | WO 00/26640 | 5/2000 |
| WO | WO 01/67831 A2 | 9/2001 |
| WO | WO 02/29357 | 4/2002 |
| WO | WO 03/043400 A1 | 5/2003 |
| WO | WO 2006/125102 | 11/2006 |

OTHER PUBLICATIONS

International Preliminary Report on Patentability for foreign application No. PCT/US2004/036238 filed Oct. 29, 2004; Notification of Transmittal of The International Search Report and Written Opinion of the International Searching Authority for application No. PCT/US2004/036238, filed Oct. 29, 2004.

International Search Report and Written Opinion from application No. PCT/US05/017425, filed May 18, 2005; Notification of Transmittal of the International Preliminary Report from application No. PCT/US05/017425, filed May 18, 2005.

International Search Report from Appln No. PCT/US2004/036683, filed Nov. 3, 2004; International Preliminary Report on Patentability from Application No. PCT/US2004/036683, filed Nov. 3, 2004.

The Notification of Transmittal of International Preliminary Examination Report in foreign application No. 2005/025905, filed Jul. 21, 2005; Copy of International Search Report and Written Opinion from foreign application No. 2005/025905, filed Jul. 21, 2005.

The International Search Report from Appln No. PCT/US/2002/36154, filed Nov. 11, 2002.

The International Prelimary Report on Patentability in foreign Appln No. PCT/US/2004/036704, filed Nov. 3, 2004; Notification of Transmittal of the International Search Report and Written Opinion of the International Searching Authority in foreign Appln No. PCT/US/2004/036704, filed Nov. 3, 2004.

The International Preliminary Report on Patentability from Appln No. PCT/US/2005/35985, filed Oct. 5, 2005; International Search Report and Written Opinion from Appln No. PCT/US/2005/35985, filed Oct. 5, 2005.

The International Search Report and Written Opinion from Appln No. PCT/US/2006/019281, filed May 18, 2006.

* cited by examiner

PICK AND PLACE MACHINE WITH IMPROVED COMPONENT PICK IMAGE PROCESSING

CROSS-REFERENCE TO RELATED APPLICATION

The present application is based on and claims the benefit of U.S. provisional patent application Ser. No. 60/717,127, filed Sep. 14, 2005, the content of which is hereby incorporated by reference in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or other adhesive until a subsequent step in which the solder paste is melted, or the adhesive is fully cured.

Pick and place machine operation is challenging. Since machine speed corresponds with throughput, the faster the pick and place machine runs, the less costly the manufactured board will be. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

Picking up a component requires the placement head to be positioned over the pick up point for the target component. Once the nozzle is so positioned, it is lowered to a point just above the component and a vacuum is applied through the nozzle which sucks the component up and temporarily attaches it to the end of the nozzle. Each component is positioned at its pick point by a component feeder mechanism. Typical feeder mechanisms include tape feeders, vibratory feeders and tray feeders. Once a component is picked up by the nozzle, the feeder mechanism must move another component into the pick position. If the component pick operation is not successful, defective work pieces are produced. Defects on work pieces that are known to be caused by bad pick operations are tombstoned components, missing components, wrong components, wrong component polarity, and misplaced components. Further, defects are also caused by operators loading feeders into incorrect positions; allowing feeders to run out of components; defective or broken feeders, component tapes and/or nozzles; incorrectly programmed nozzle pick heights; and incorrectly positioned components.

Providing a method of assessing the effectiveness of a pick operation without slowing machine throughput, and without adding significant hardware to the pick and place machine, would allow pick and place machine operation to more accurately identify pick errors, and ensure that such errors do not generate defective workpieces. Additionally, identifying pick errors before they create defective work pieces (such as entire circuit boards) would vastly simplify rework since the pick and place machine can simply discard the erroneously picked component and pick another one. In contrast, if the erroneously picked component is actually placed upon the workpiece, the error may not be discovered until after final soldering or adhesive curing is complete. Given that a particular workpiece, such as a circuit board, may contain hundreds or even thousands of individual components, the workpiece itself could be relatively costly, and require relatively costly manual rework in order to ensure that the entire workpiece is not lost.

SUMMARY

A pick and place machine includes a sensor disposed to acquire an image of a nozzle before a pick operation, and one or more images after the pick operation. Image analytics based upon these images reveal important characteristics that can be used to classify the pick operation. In some embodiments, a plurality of after-pick images are acquired at different poses (angular orientations).

DETAILED DESCRIPTION OF ILLUSTRATIVE EMBODIMENTS

Figure 1:
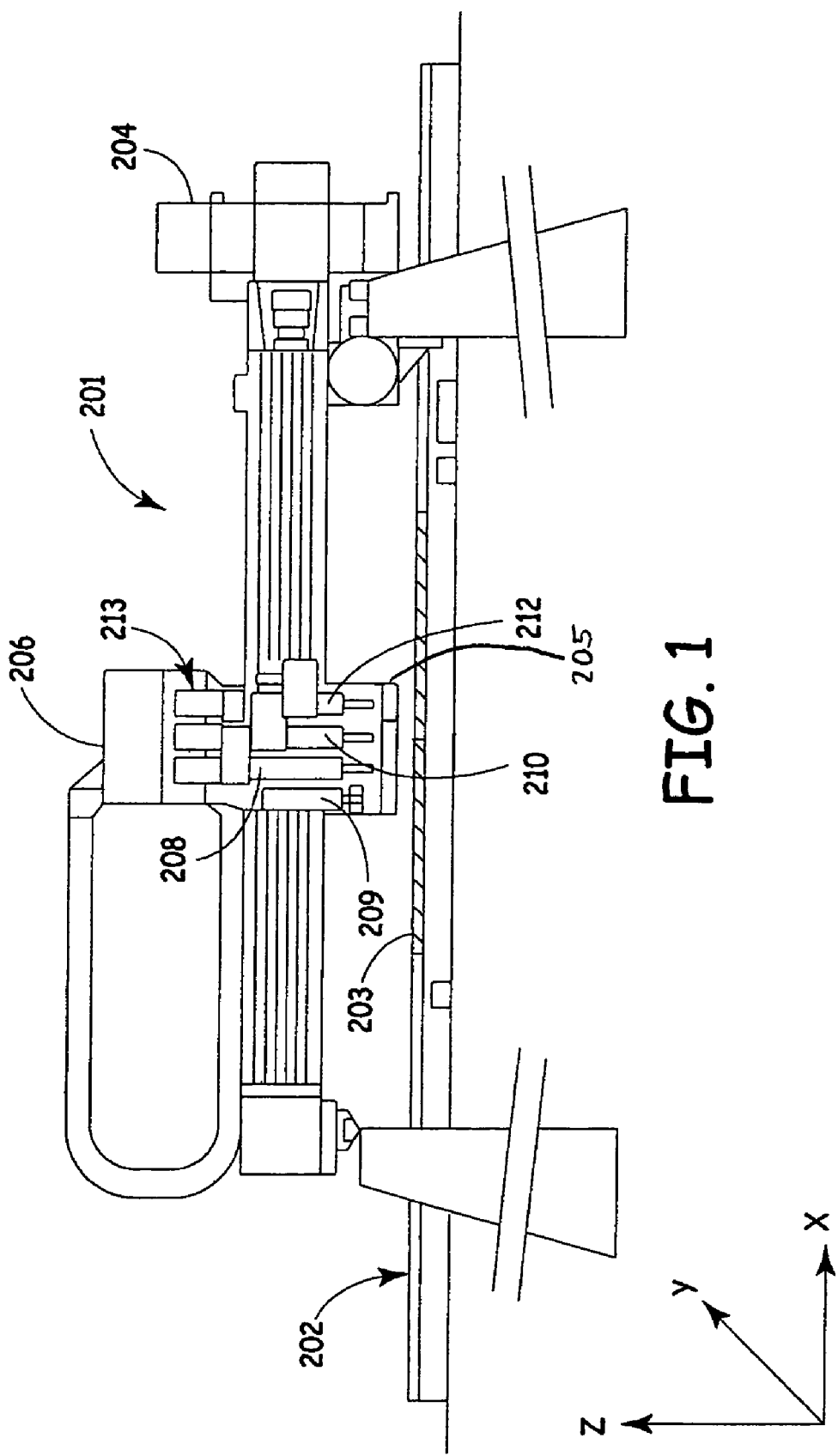
FIG. 1 is a diagrammatic view of an exemplary Cartesian pick and place machine with which embodiments of the present invention are applicable.

FIG. 1 is a diagrammatic view of an exemplary Cartesian pick and place machine 201 with which embodiments of the present invention are applicable. Pick and place machine 201 receives a workpiece, such as circuit board 203, via transport system or conveyor 202. A placement head 206 then obtains one or more electrical components to be mounted upon workpiece 203 from component feeders (not shown) and moves in x, y and z directions, relative to workpiece 203, to place the component in the proper orientation at the proper location upon workpiece 203. Placement head 206 may include sensor 205 that is disposed to view one or more components held by respective one or more nozzle, from a substantially side view as placement head 206 moves the component(s) from pickup locations to placement locations. Sensor 205 allows placement machine 201 to view components held by nozzles 208, 210, 212 such that pick efficacy can be determined prior to mounting the component(s) upon workpiece 203. Other pick and place machines may employ a placement head that moves over a stationary camera to image the component. Placement head 206 may also include a downwardly looking camera 209, which is generally used to locate fiducial marks upon workpiece 203 such that the relative location of placement head 206 with respect to workpiece 203 can be readily calculated.

Figure 2:
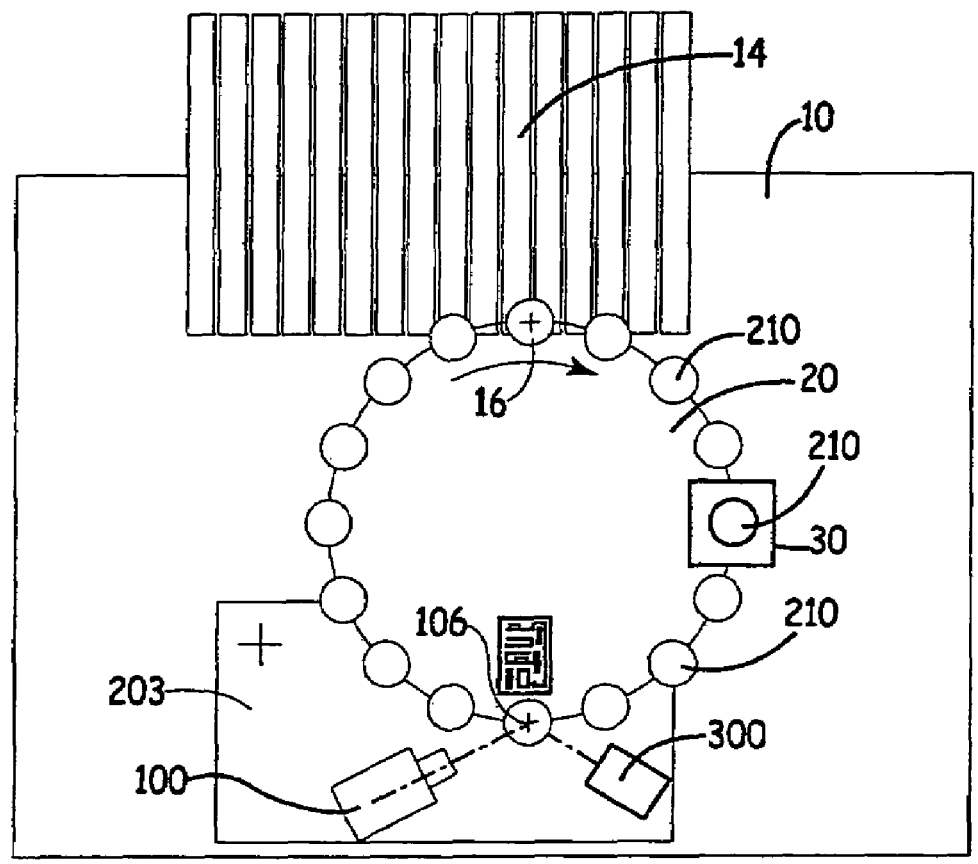
FIG. 2 is a diagrammatic view of an exemplary rotary turret pick and place machine with which embodiments of the present invention are applicable.

FIG. 2 is a diagrammatic view of an exemplary rotary turret pick and place machine 10 with which embodiments of the present invention are applicable. Machine 10 includes some components that are similar to machine 201 and like components are numbered similarly. For turret pick and place machine 10, workpiece 203 is loaded via a conveyor onto an x-y stage (not shown). Attached to main turret 20 are placement heads 210 that are disposed at regular angular intervals around the rotating turret. During each pick and placement cycle, turret 20 indexes an angular distance equal to the angular distance between adjacent placement nozzles 210. After turret 20 rotates into position and workpiece 203 is positioned by the x-y stage, a placement nozzle 210 obtains a component 304 (shown in FIG. 3) from a component feeder 14 at a defined pick point 16. During this same interval, another nozzle 210 places a component 304 onto the workpiece 203 at a preprogrammed placement location 106. Additionally, while turret 20 pauses for the pick and place operation, upward looking camera 30 acquires and image of another component 304, which may provide alignment information for that component. This alignment information is used by pick and place machine 10 to position workpiece 203 when placement nozzle 210 is positioned several steps later to place component 104. After the pick and place cycle is complete, turret 20 indexes to the next angular position and workpiece 203 is repositioned in x-y direction(s) to move the placement location to position which corresponds to the placement location 106.

Figure 3:
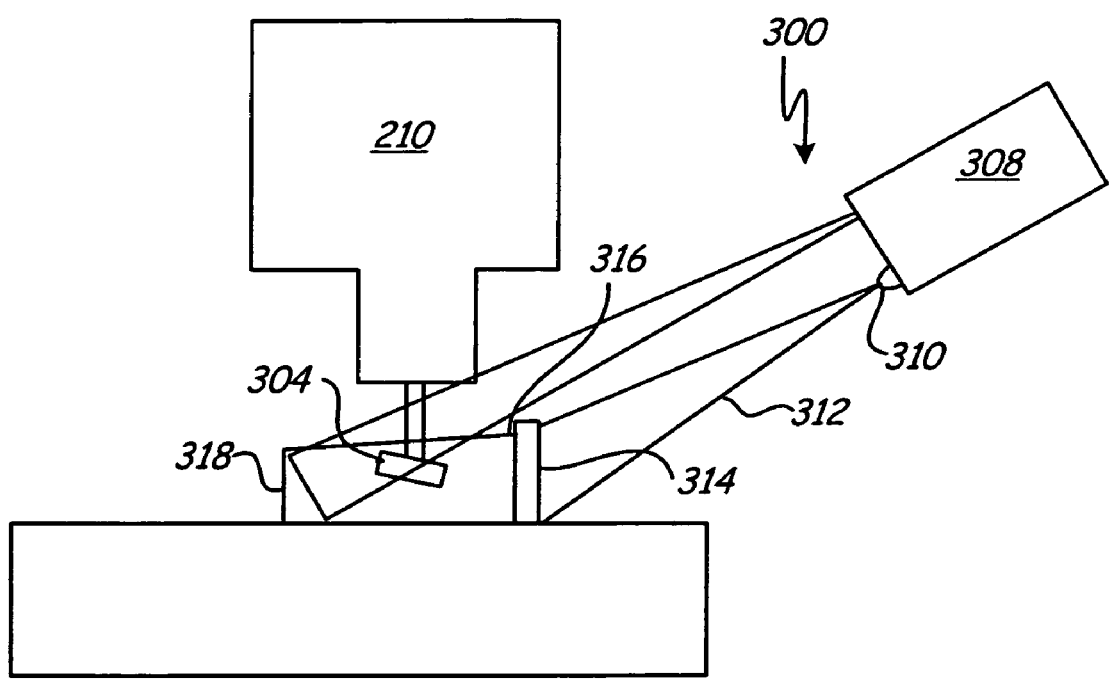
FIG. 3 is a diagrammatic view of an image acquisition system disposed to acquire one or more images relative to a pick operation in accordance with an embodiment of the present invention.

FIG. 3 is a diagrammatic view of image acquisition system 300 disposed to acquire one or more images relative to a pick operation in accordance with an embodiment of the present invention. Image acquisition system 300 preferably includes an electronic camera 308 that may include a suitable charge couple device, or complimentary metal oxide semiconductor device. System 300 is disposed to view component 304 when component 304 is held by nozzle 210. Image acquisition system 300 may have an optical axis that is arranged to view component 304 from a non-zero angle with respect to horizontal. However, embodiments of the present invention can be practiced wherein image acquisition system 300 does, in fact, view component 304 using an optical axis having a zero angle with respect to the horizontal. System 300 also preferably includes an illuminator 310 that generates illumination 312, which illumination 312 is redirected by illumination optics 314. Redirected illumination 316 passes through the area proximate component 304 when component 304 is retained on nozzle 210. Imaging optics 318 is disposed to redirect and focus the illumination upon image acquisition system 300. The utilization of illumination optics 314 and imaging optics 318 allows image acquisition system 300 to obtain a backlit substantially side elevation view of component 304, even though component 304 is maintained at an angle that is different than the optical imaging axis of image acquisition system 300. Image acquisition system 300 obtains an image of nozzle 210 prior to nozzle 210 picking component 304 from component feeder 14. Then, after component 304 has been picked by nozzle 210, image acquisition system 300 obtains one or more post-pick images. A comparison of the before and after-pick images provides important information relative to the effectiveness of the pick operation.

Figure 4:
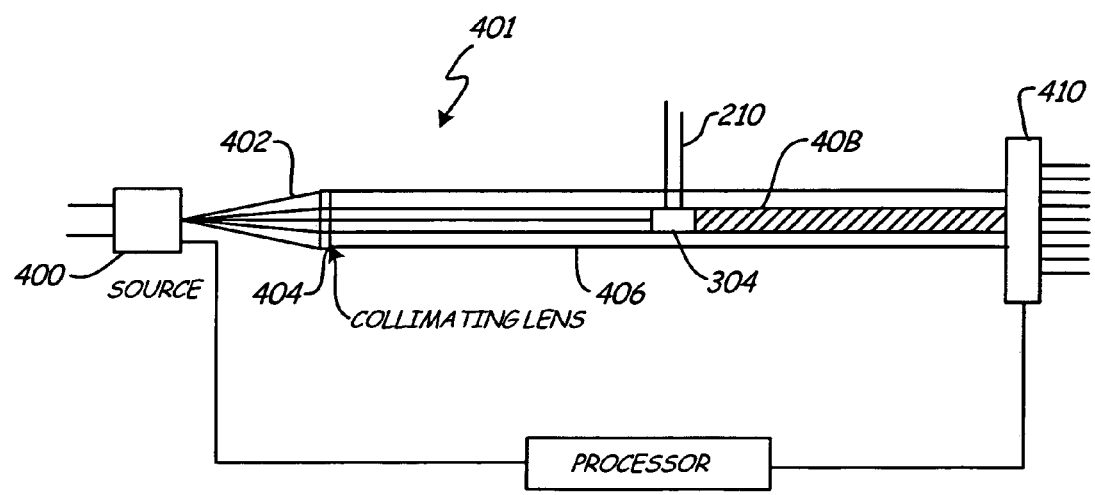
FIG. 4 is a diagrammatic view of a sensor for sensing component hose upon a pick and place machine nozzle in accordance with an embodiment of the present invention.

FIG. 4 is a diagrammatic view of a sensor for sensing components on a pick and place machine nozzle in accordance with an embodiment of the present invention. Sensor 401 includes illumination source 400 disposed to generate diverging illumination 402 which illumination 402 enters collimating optics 404 and is transformed into collimated illumination 406. As collimated illumination 406 impinges upon component 304, some of the illumination is blocked generating component shadow 408. Component shadow 408 is detected by area detector 410. Area detector 410 is coupled to a suitable signal processor 411 or image processor to process the image or images acquired of the shadow component 304. Processor 411 can be a suitable microprocessor disposed within sensor 401, or processor 411 could be a remote processor, such as a microprocessor disposed within the pick and place machine. By processing the image(s), various measures of component 304 can be determined, including apparent height, width and angle. One or more of these measures facilitate the determination of the quality of the pick operation. If component 304 meets "good pick" criteria, component 304 will be placed on the printed circuit board.

Figure 5:
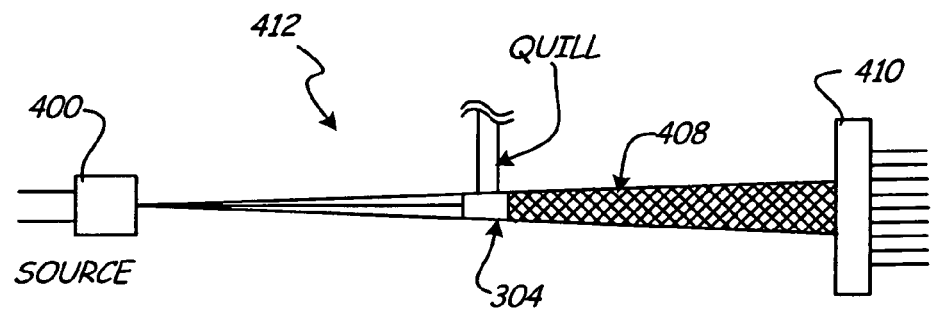
FIG. 5 is a diagrammatic view of a compact component sensor in accordance with another embodiment of the present invention.

FIG. 5 is a diagrammatic view of a compact component sensor in accordance with another embodiment of the present invention. While processor 411 is not shown in FIG. 5, such illustration is provided in order to contrast the differences in the embodiments illustrated in FIG. 4 and 5, and sensor 412 would indeed employ an image processor, such as processor 411. Sensor 412 includes source 400 and detector 410, but does not include any imaging or illumination optics. Shadow 408 of component 304 continues to diverge, and is considered, an unfocused shadow. Notwithstanding the fact that shadow 408 is unfocused, image processing is still able to render a number of important measurements with respect to the pick effectiveness.

Figure 6:
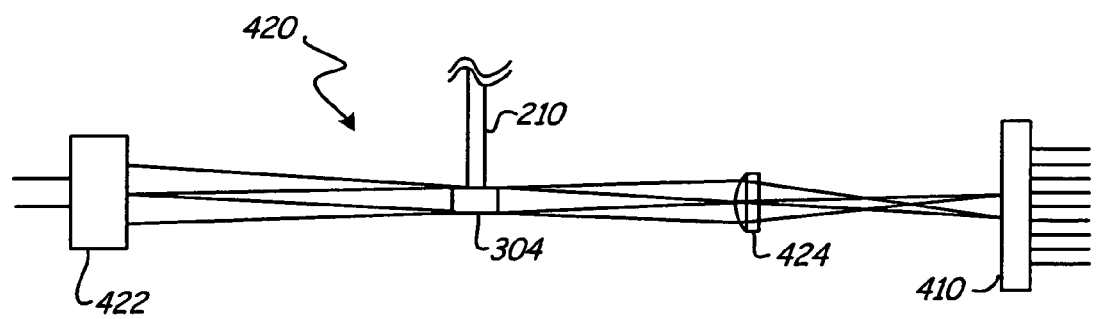
FIG. 6 is a diagrammatic view of sensor in accordance with another embodiment of the present invention.

FIG. 6 is a diagrammatic view of sensor 420 in accordance with another embodiment of the present invention. While processor 411 is not shown in FIG. 6, such illustration is provided in order to contrast the differences in the embodiments illustrated in FIG. 4, 5 and 6, and sensor 420 would indeed employ an image processor, such as processor 411. Sensor 420 includes illuminator 422 that is an area source of back light for component 304 on nozzle 210. Sensor 420 also includes optical element 424 disposed between component 304 and detector 410. Element 424 provides a focused shadow image of component 304 upon detector 410.

The sensor embodiments illustrated in FIGS. 4-6 generally provide a very compact sensor design. This compact design, in turn, allows the sensor to be easily incorporated onto a moving placement head, such as a placement head of a Cartesian pick and place machine. Using area array detectors to obtain shadows of components held by nozzles of a pick and place machine can provide a number of important metrics with respect to the effectiveness of the pick operation. Various types of image processing can be used on one or more such shadow images.

Figure 7:
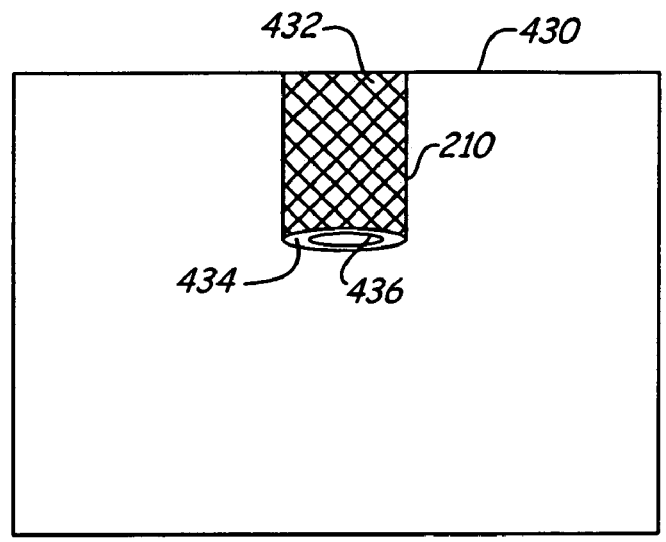
FIG. 7 is a diagrammatic view of a representative before-pick image in accordance with an embodiment of the present invention.

FIG. 7 is a diagrammatic view of a representative before-pick image 430 of nozzle. 210. As can be seen, nozzle 210 presents a shadow image indicated by cross hatching 432. The distal end 434 of nozzle 210 is shown having aperture 436 through which a vacuum is typically applied. Once component 304 is picked up by nozzle 210, the component 304 is retained upon distal end 434 of nozzle 210.

Figure 8:
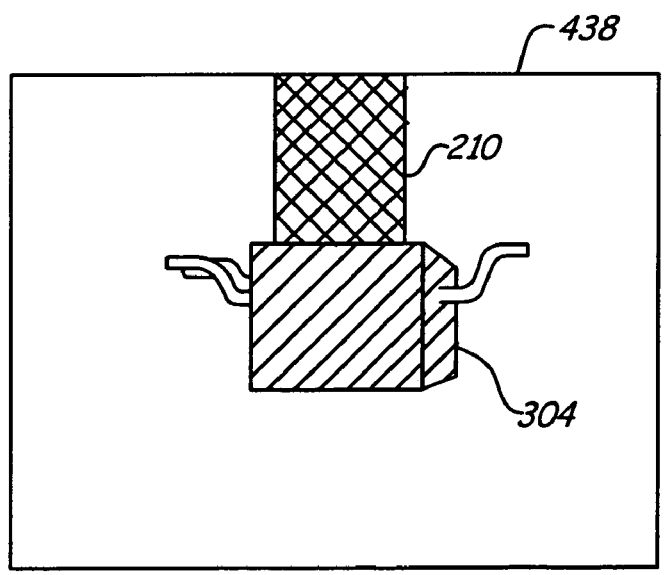
FIG. 8 is a diagrammatic view of an image acquired after a component has been picked up by nozzle in accordance with an embodiment of the present invention.

FIG. 8 is a diagrammatic view of an image 438 acquired after a component 304 has been picked up by nozzle 210. Component 304 is illustrated as a standard SOT23 component, but may be any component. Additionally, the image of component 304 is a shadow image. The vacuum applied through aperture 436 adheres component 304 to distal end 434 of nozzle 210.

Figure 9:
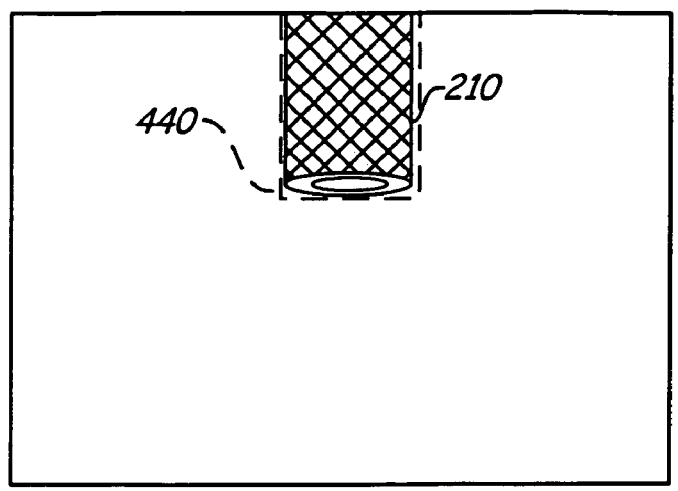
FIG. 9 is a diagrammatic view of a before-pick nozzle image being used to generate a template in accordance with an embodiment of the present invention.

FIG. 9 is a diagrammatic view of nozzle 210 in image 430 being used to generate template 440. The use of template 440 is important for subsequent correlation to after-pick images. The manner in which the nozzle pattern is extracted from before-pick image 430 can be done in any suitable way using known techniques, or later developed techniques.

Figure 10:
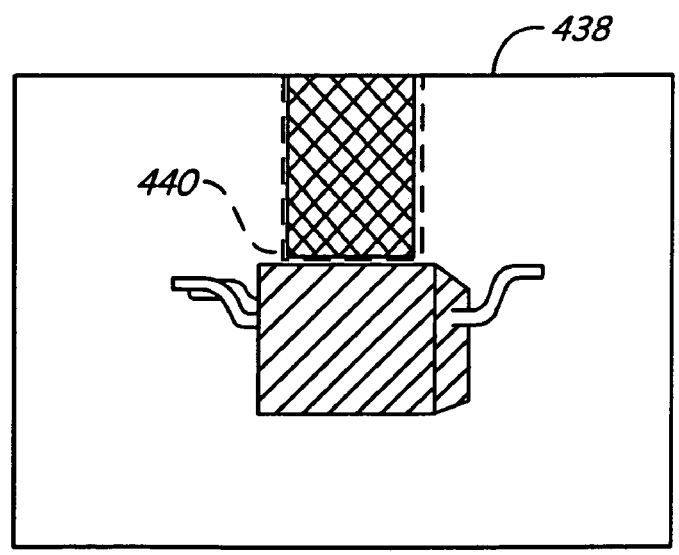
FIG. 10 is a diagrammatic view of a template being used with after-pick image in accordance with an embodiment of the present invention.
Figure 11:
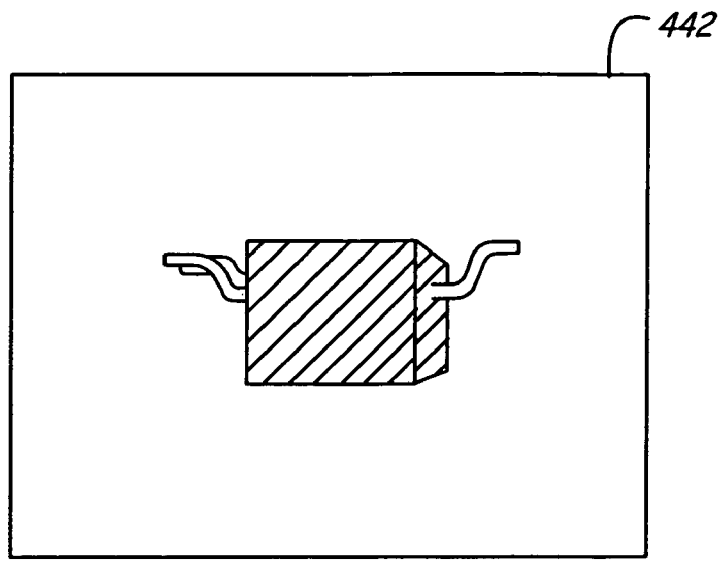
FIG. 11 is a diagrammatic view of a difference image derived by subtracting the before-image from the co-registered after-image.
Figure 12:
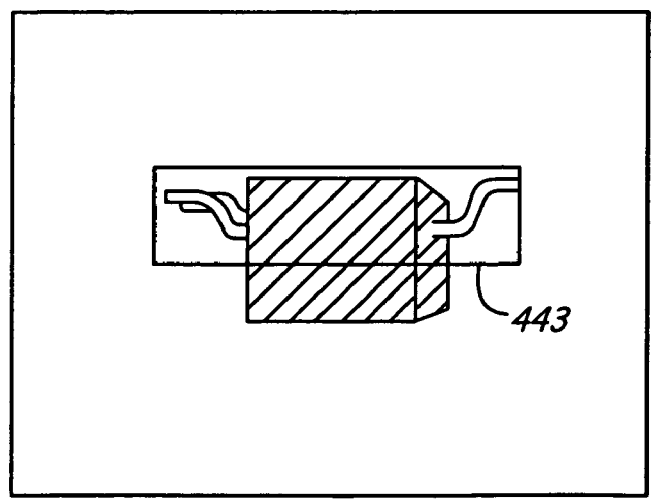
FIG. 12 is a diagrammatic view illustrating an extracted vertical center as well as left and right most component points in accordance with an embodiment of the present invention.

FIG. 10 illustrates template 440 being used with after-pick image 438. Template 440 is used in a correlation search to identify nozzle 210 in the after-pick image. One way in which this correlation can be done is using a known normalized gray-scale correlation (NGC) based correlation search. Once nozzle 210 has been identified in the after-pick image, difference image 442 (shown in FIG. 11) is derived by subtracting the before-image, pixel by pixel, from the co-registered after-image. The difference image will generally contain the picked component 304 as well as some artifacts (caused by the shadow casting scheme). These artifacts are preferably suppressed by using an automatic thresholding technique, such as that disclosed in the paper entitled, "A Threshold Selection Method for Gray Level Histogram." N. Otsu 1979, IEEE Transactions on Systems, Man and Cybernetics, SMC-9(1). Additionally, a morphological closing operation can be applied to the thresholded image to improve connectivity within blobs. The blobs are preferably labeled using a simple region growing technique and all but the largest blob (presumably the component) are suppressed. The non-suppressed blob corresponds to the picked component. A minimum enclosing rectangle is computed for this largest blob and the left and right most coordinates of the blob are noted. The extracted component's vertical center is also calculated. Rectangle 443 illustrating the extracted vertical center as well as left and right most points are illustrated in FIG. 12. If the vertical coordinate (Y) of either the left most or the right most part pixel falls in the component's vertical half closer to the nozzle, then it is concluded that the component has been picked upside down. A digital signal processor, such as processor 411, is programmed with these simple operations. Specifically, let $L_y$ be the vertical (Y) coordinate of the left most pixel of the extracted component; let $R_y$ be the vertical (Y) coordinate of the right most pixel of the extracted component; and let $C_y$ by the vertical (Y) center of the extracted component. Then, let left offset equal $L_y$-$C_y$. Additionally, let right offset equal $R_y$-$C_y$. Assuming that (0,0) is the left top corner, and the component is below the nozzle in the captured view, then if left offset is greater than 0 or right offset is greater than 0, conclude that component 304 has been picked upside down. Otherwise conclude that component 304 has been correctly picked. Note, these processing steps can be applied to both focused shadows as well as non-focused shadows.

Figure 13:
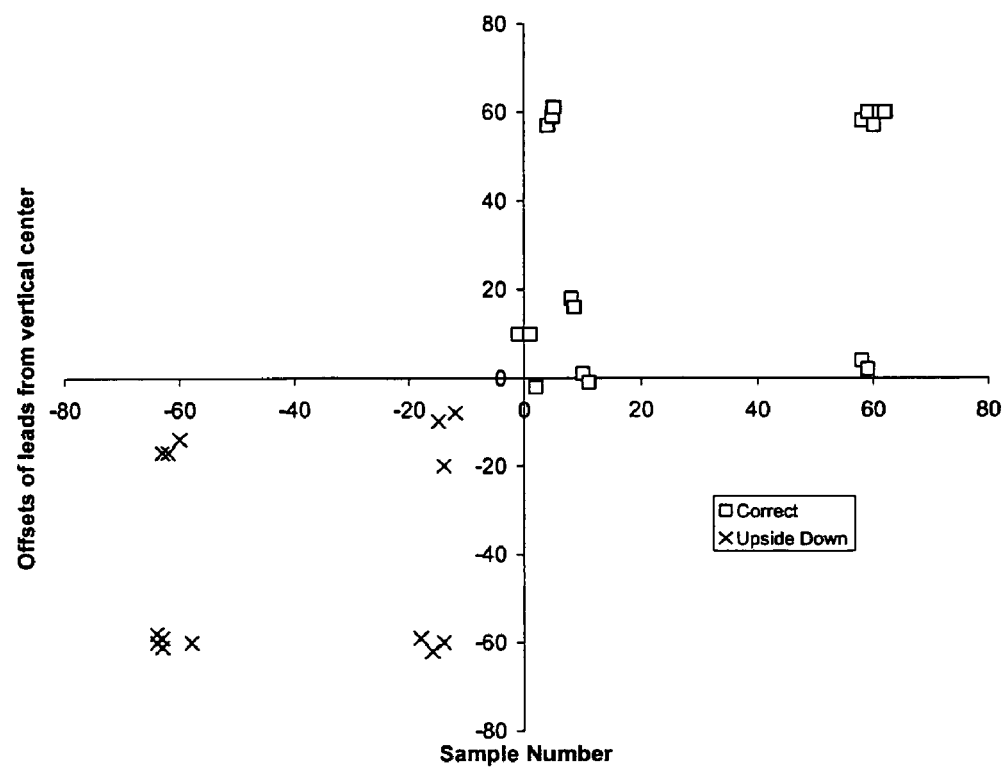
FIG. 13 is a chart of offsets of leads from vertical center for various components.

FIG. 13 is a chart of offsets of leads from vertical center for various components. FIG. 13 illustrates flipped pick identification using lead vertical offsets from the component's vertical center. As illustrated in FIG. 13, the correctly placed parts are generally in the positive X and Y axes, while incorrectly placed parts are in the negative −X and −Y axes.

The above example of image analysis for component shadows on a nozzle of a pick and place machine provide a number of advantages. Specifically, co-registration of before and after-pick images based on the nozzle pattern provides accurate, robust and reliable registration methods. Additionally, NGC-based searching is very suitable for digital signal processing. Further, image processing operations are simple enough to be programmed into commercially available digital signal processors. Further still, significant information can be extracted from even a single view in order to successfully identify an incorrect pick (such as an upside down pick). Moreover, the image processing operations are simple enough so that the required measurements can be computed quickly to meet the need of real-time operation.

Figure 14:
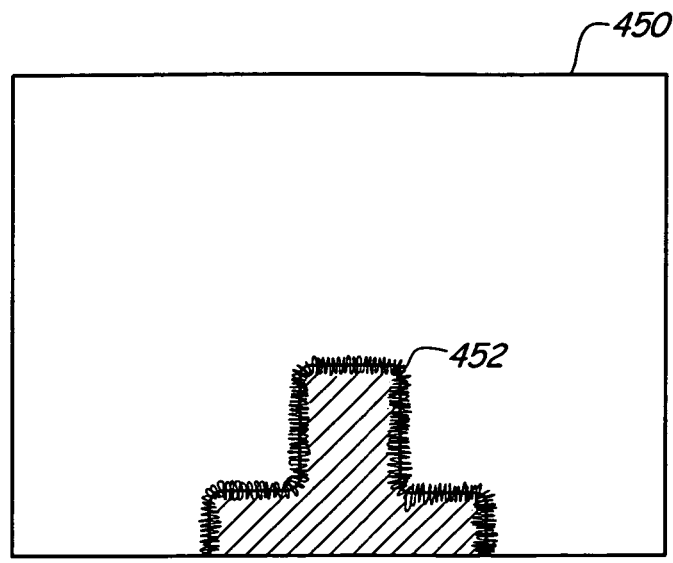
FIG. 14 is a diagrammatic view of a non-focused before-pick image acquired in accordance with an embodiment of the present invention.
Figure 15:
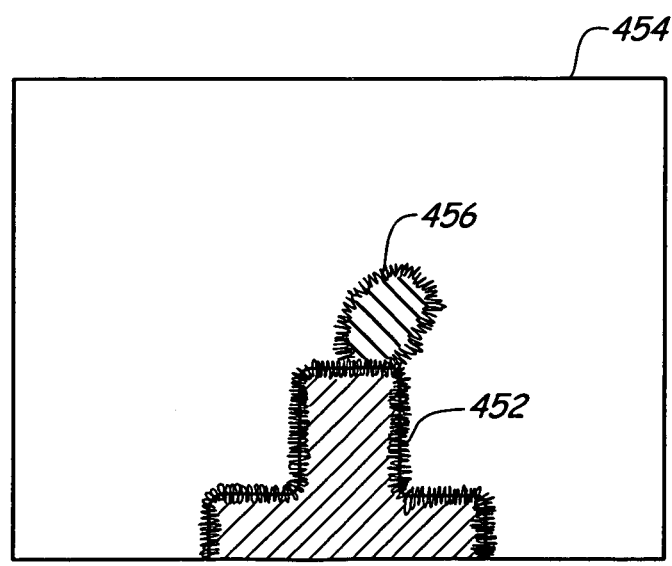
FIG. 15 is a diagrammatic view of a blurred after-pick image acquired in accordance with an embodiment of the present invention.
Figure 16:
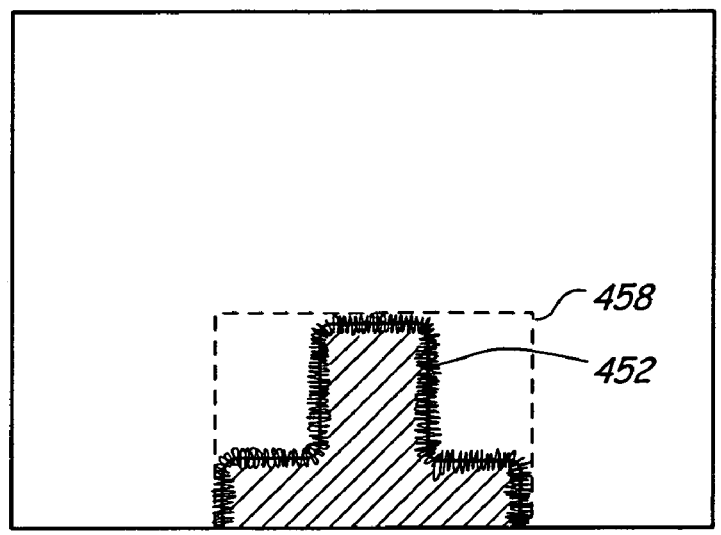
FIG. 16 is a diagrammatic view of a blurred before-pick nozzle image being used to generate a template in accordance with an embodiment of the present invention.

FIG. 14 is a diagrammatic view of non-focused before-pick image 450. Image 450 shows blurred nozzle 452. FIG. 15 shows after-pick image 454 depicting component 456 disposed upon nozzle 452. FIG. 16 illustrates a template 458, similar to template 440 illustrated in FIG. 9, which template 458 is used to isolate nozzle 452 in after-pick images.

Figure 17:
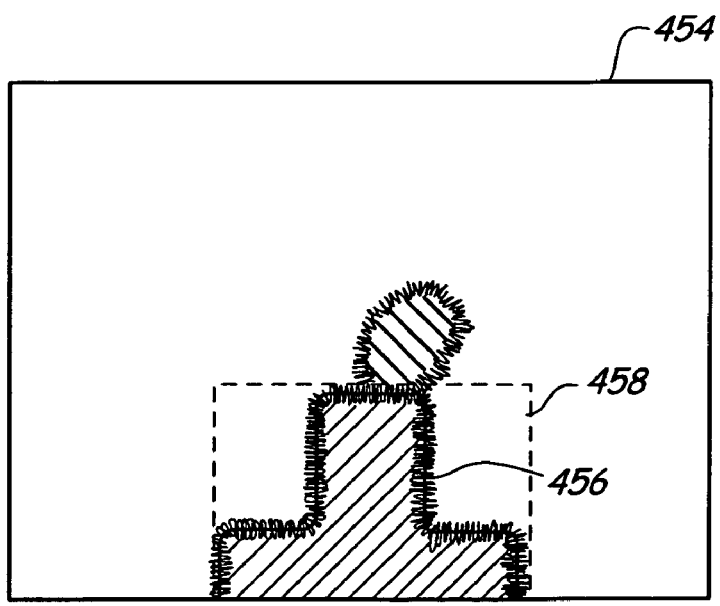
FIG. 17 is a diagrammatic view illustrating a template being used to identify a nozzle in an after-pick image in accordance with an embodiment of the present invention.
Figure 18:
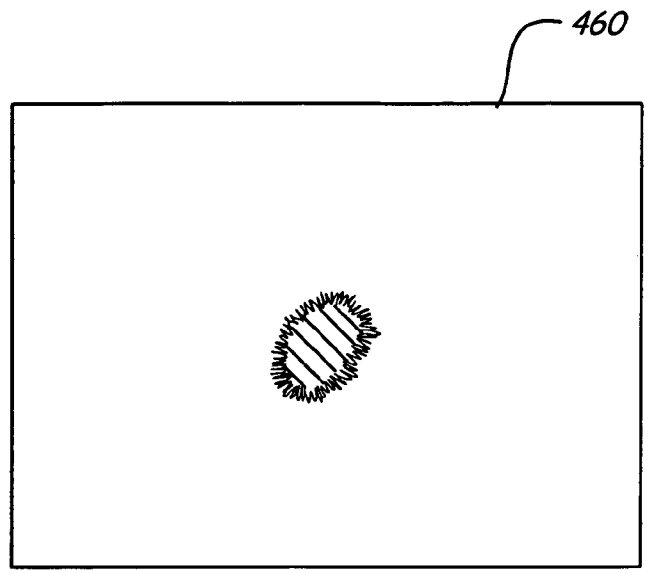
FIG. 18 is a diagrammatic view of a blurred difference image derived by subtracting a blurred before-pick image from a co-registered blurred after-pick image.

FIG. 17 illustrates template 458 being used to identify nozzle 456 in the after-pick image 454. Various methods exist to co-register two images, such as correlating the entire image, correlating specific sections on both sides of the nozzle, et cetera. However, it is preferred that image analysis utilize the before-pick image and extract the nozzle pattern therefrom in order to use the extracted nozzle pattern as a template in an NGC-based correlation search. Difference image 460 (illustrated in FIG. 18) is derived by subtracting before-pick image 450 from the co-registered after-pick image 454. Difference image 460 will contain some artifacts (caused by the shadow casting scheme). The artifacts are preferably suppressed by an automatic thresholding technique such as that described above with respect to the Otsu paper. Further still, it is preferred that a morphological closing operation be applied to the threshold image to improve connectivity within blobs.

As described above, the blobs are preferably labeled using a simple region growing technique and all but the largest blob are suppressed. The remaining blob corresponds to the picked component. A minimum enclosing rectangle is computed for this largest blob and features such as component height (vertical extent) and component width (horizontal extent), and aspect ratio (height/width) are computed. Additionally, moments of inertia about the x, y and XY-axis are computed and the orientation of the major axis is derived from these three moments. Additionally, from the X-centers of the part and the nozzle, part offset from the nozzle center is also computed. These simple operations are easily programmed into a digital signal processor, such as commercially available digital signal processors.

Figure 19:
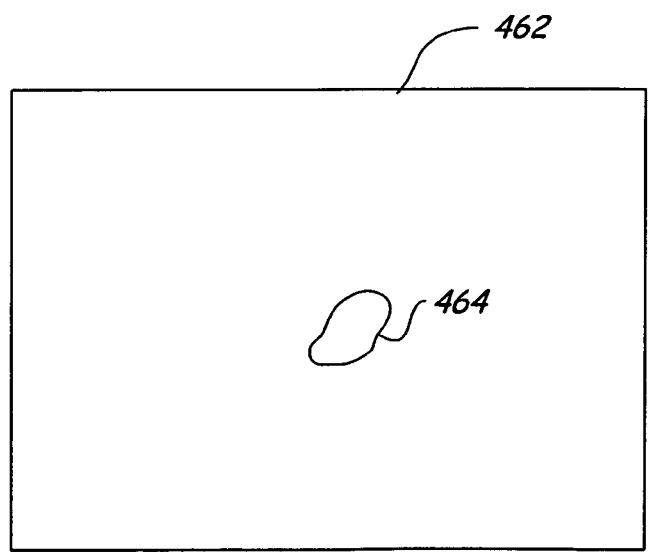
FIG. 19 is a diagrammatic view of an image containing a blob related to the image of the picked component, in accordance with an embodiment of the present invention.
Figure 20:
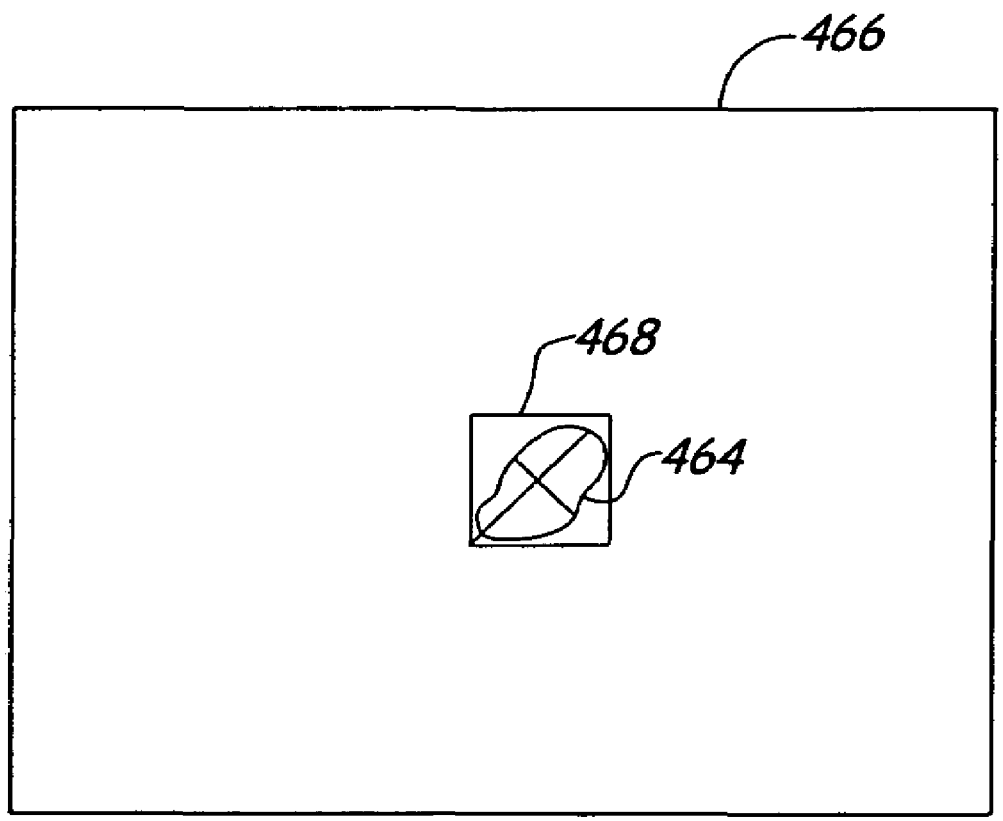
FIG. 20 is a diagrammatic view of an image constructing a rectangle about a blob in order measure a characteristic of the blob.

FIG. 19 is a diagrammatic view of image 462 containing blob 464 related to the image of the picked component. Further, FIG. 20 shows image 466 having rectangle 468 constructed about blob 464 in order to determine moments of inertia, et cetera. The measurements that can be performed based upon the component image include apparent component height, aspect ratio (height/width) and orientation of the major axes. These measurements, alone and in certain combinations, are capable of characterizing a given pick as good or bad. To successfully use the apparent height and aspect ratio to classify a pick, some a-priori knowledge of the component may be necessary. However, the orientation of the major axes measurement alone may be sufficient to classify a pick provided in established threshold of allowable orientations is known. However, measurements from more than one view, or angular orientation of the component upon the nozzle may be necessary to unambiguously classify a pick. If a-priori knowledge of the component is not available, then it is still possible to classify a pick as good or bad from measurements made from a number of views, such as three views. These three views are spaced at appropriate intervals, for example 45° apart. Comparing the apparent component heights and widths based upon each view for the three views, a component pick can be classified as good or bad. The rules to classify a pick based on apparent component height are:

Rule 1: If the component height is greater than the component width from the measurement made from the first view then it is considered a bad pick.

Rule 2: If rule 1 fails, then compare the component height of the first view against the minimum component widths of the second and third views. If the component height of the first view is greater than the above minimum, then it is bad pick.

Rule 3: If both rules 1 and 2 fail, then the pick has a high probability of being good.

Note, these processing steps can be applied to both the non-focused shadows as well as focused shadows with back lighting. Thus, this analysis can be employed not only for the images illustrated with respect to FIGS. 16-20, but also those illustrated in FIGS. 9-15.

Figure 21:
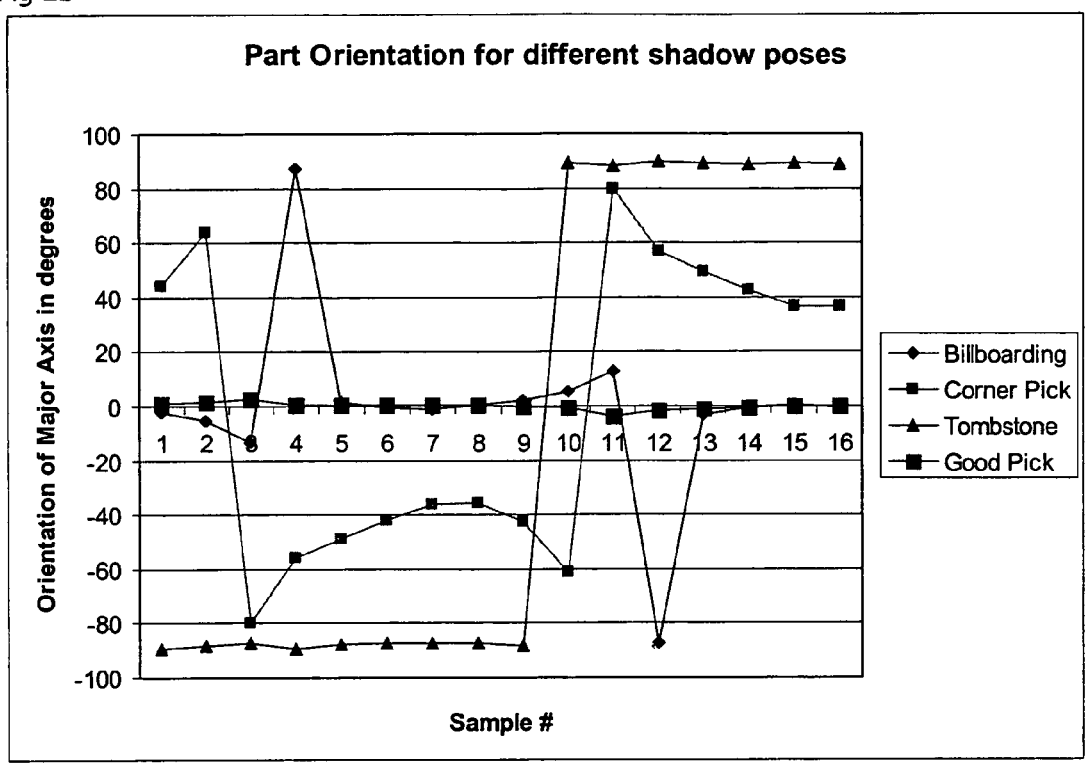
FIG. 21 is a graph illustrating the way in which the orientation of the major axis in degrees varies for different poses (angular orientations) of a component on a nozzle.
Figure 22:
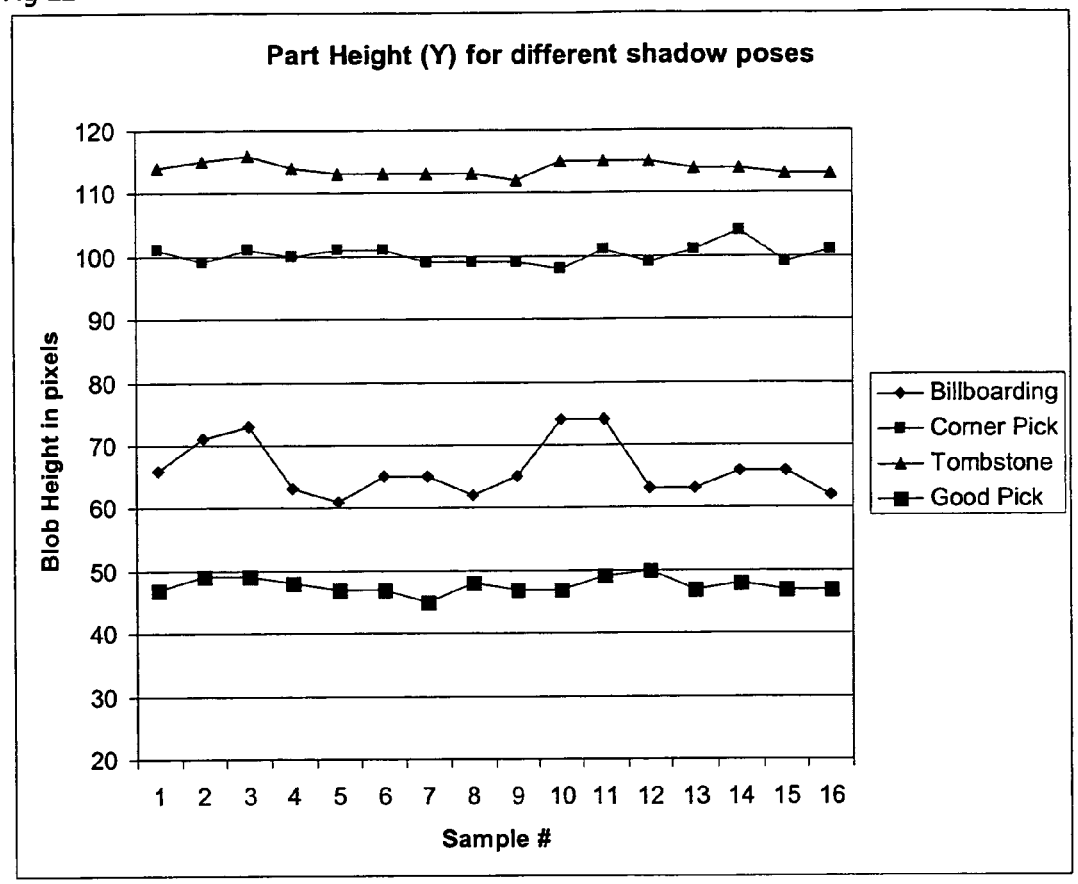
FIG. 22 is a graph illustrating the way in which the blob height varies for different poses (angular orientations) of a component on a nozzle.
Figure 23:
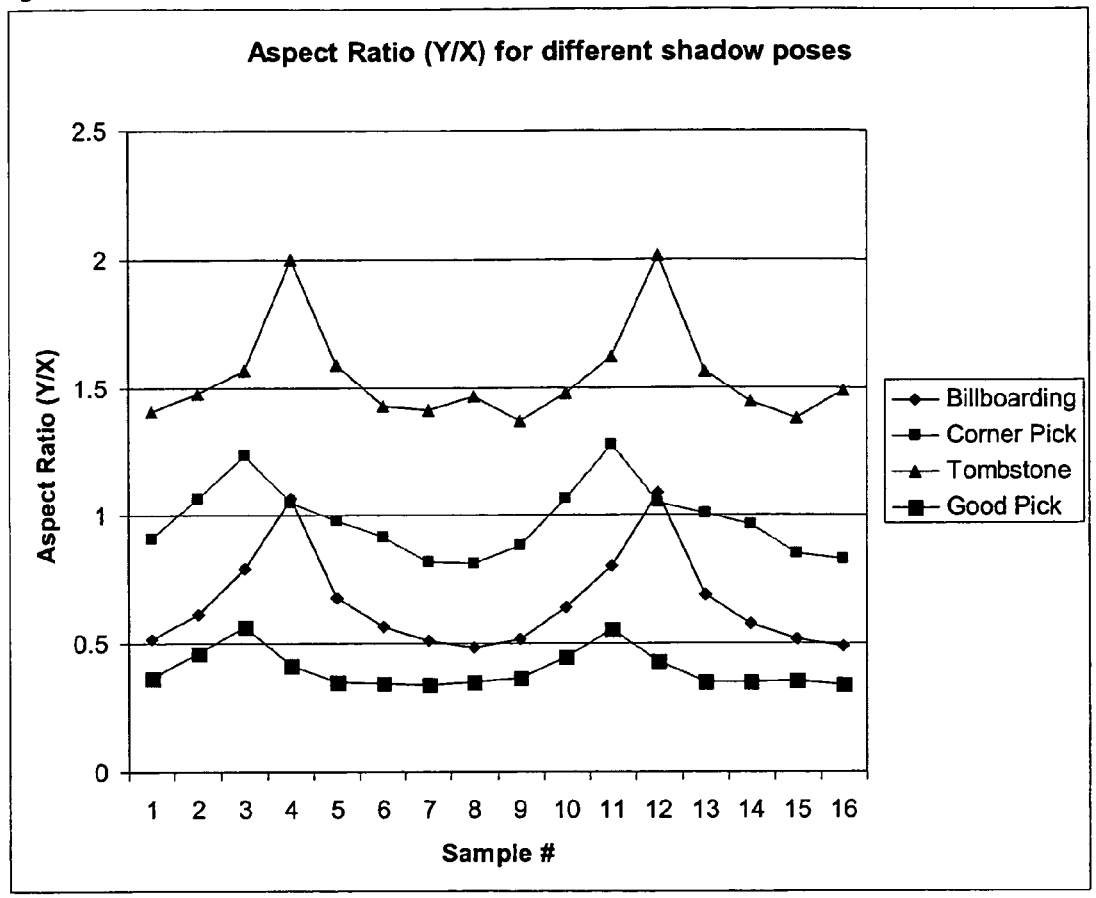
FIG. 23 is a graph illustrating the way in which the aspect ratio varies for different poses (angular orientations) of a component on a nozzle.

FIG. 21 is a chart illustrating the way in which the orientation of the major axis varies for different poses (angular orientations) of a component on a nozzle. As illustrated in FIG. 21, as a component on the nozzle is rotated through 16 different shadow poses, a component that has been properly picked will have very little variability. In distinct contrast, various pick errors, such as billboarding, corner picks, and tombstoning, generate drastically varying orientations of major axis values as the various shadow poses are acquired. FIGS. 22 and 23 also indicate that a good pick can also be determined from a number of poses using different metrics, such as blob height (FIG. 22) and aspect ratio (FIG. 23).

Figure 24:
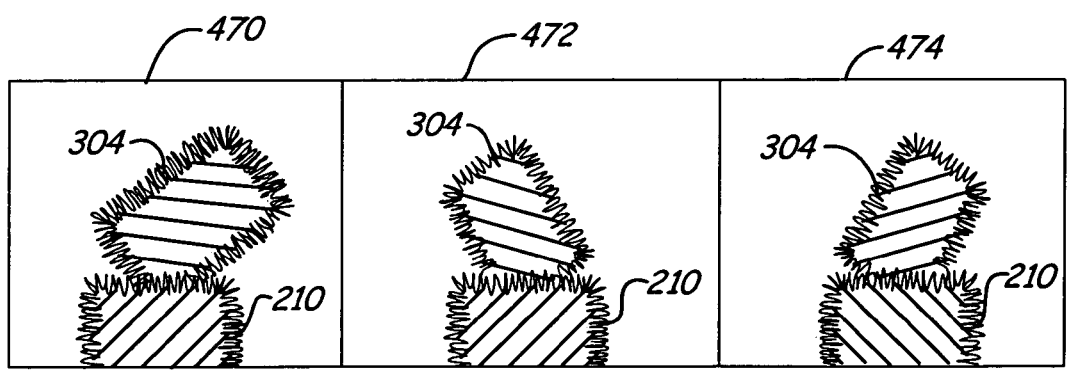
FIG. 24 is a diagrammatic view of a series of images, each depicting a non-focused shadow image of a component disposed upon a nozzle at a different angular orientation, in accordance with an embodiment of the present invention.

FIG. 24 shows a series of images 470, 472, 474 each depicting a non-focused shadow image of a 10 component 304 disposed upon a nozzle 210 at a different angular orientation (pose). It is known for pick and place machines to have a rotatable nozzle such that the angular orientation of the component can be adjusted to correctly place the component in is its proper orientation upon the workpiece. In accordance with an embodiment of the present invention, a plurality of after-pick shadow images are acquired with each image being acquired while the part is in a different pose. The image analytics described above can be performed on one or all of the after-pick shadow images and the extracted metrics can be compared for each of the poses. A component that has been properly picked, will have significantly less variance in the various extracted metrics than an erroneously picked component.

Figure 25:
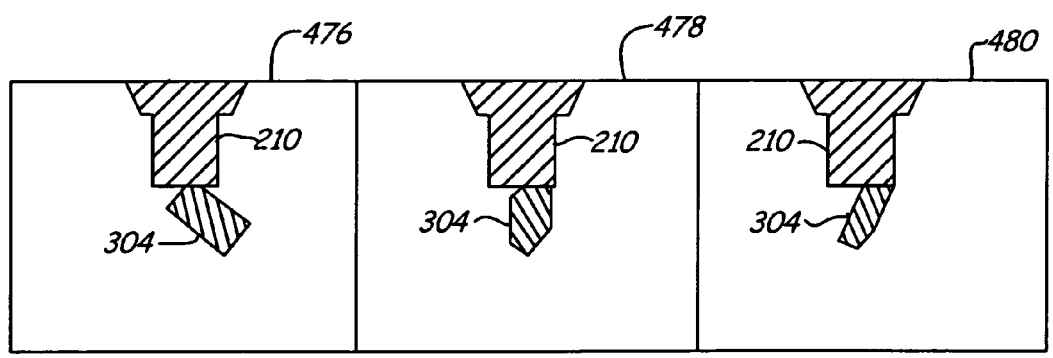
FIG. 25 is a diagrammatic view of a series of images showing a component retained upon a nozzle in a plurality of different poses.
Figure 26A:
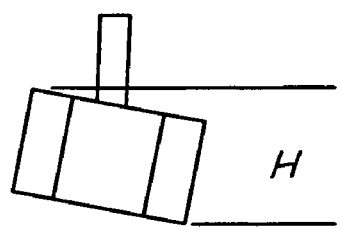
FIGS. 26A, 26B and 26C are diagrammatic views illustrating various metrics such as height (H), width (W), and angle of major axis orientation (theta-$\theta$).
Figure 26B:
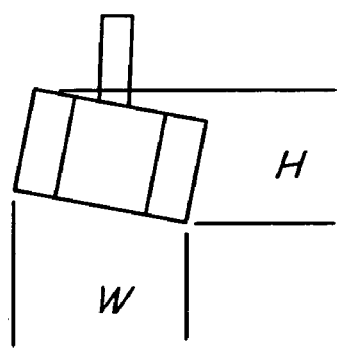
Figure 26C:
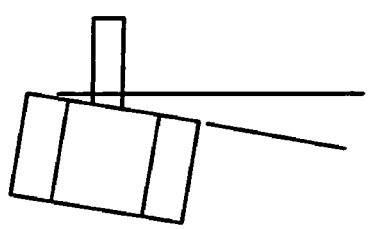
Figure 27:
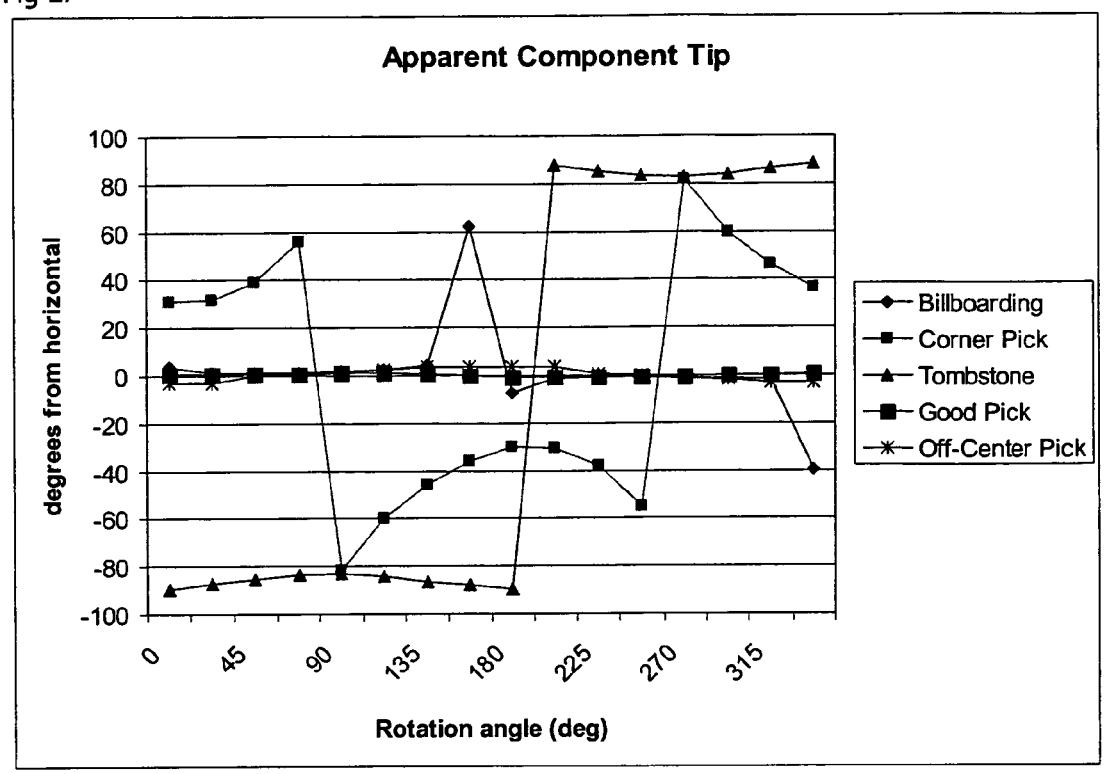
FIGS. 27-29 are graphs illustrating how various component metrics such as apparent component tip (FIG. 27), apparent relative component height (FIG. 28), and apparent component aspect ratio (FIG. 29) vary with different component poses.
Figure 28:
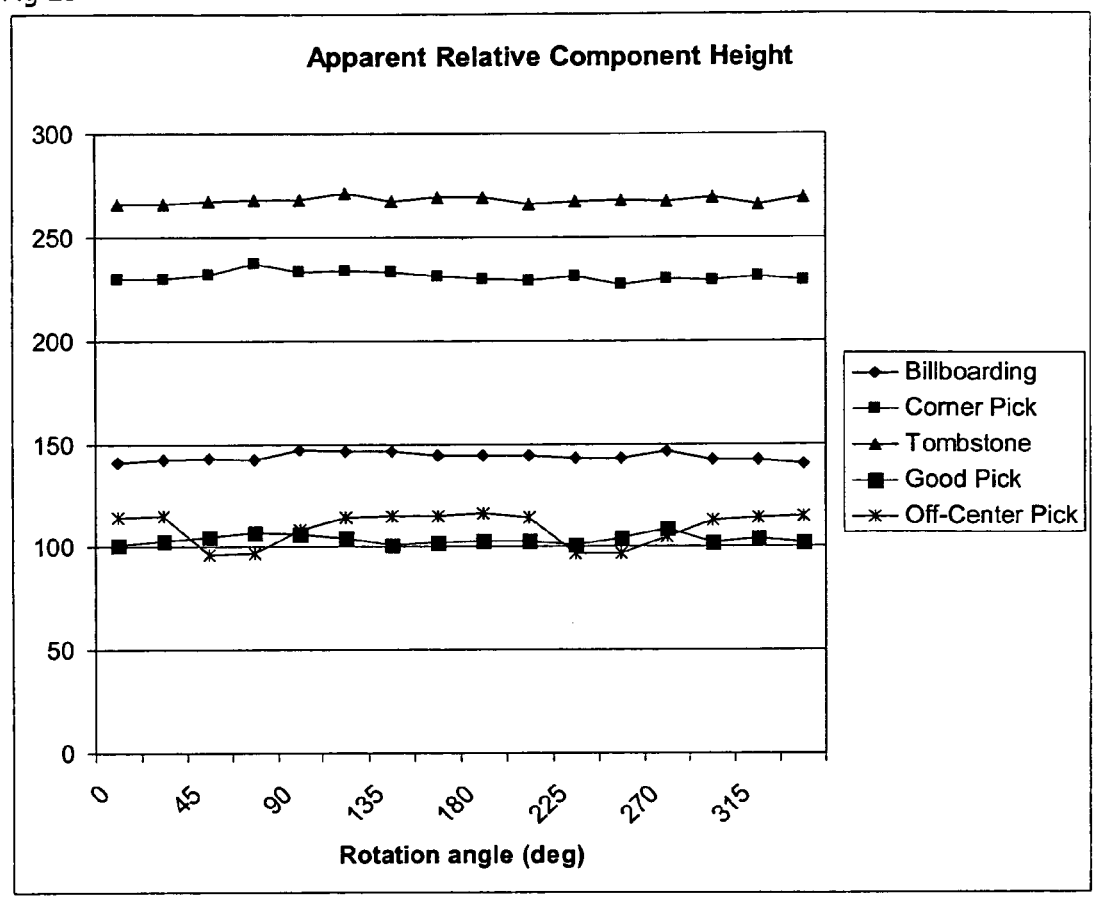
Figure 29:
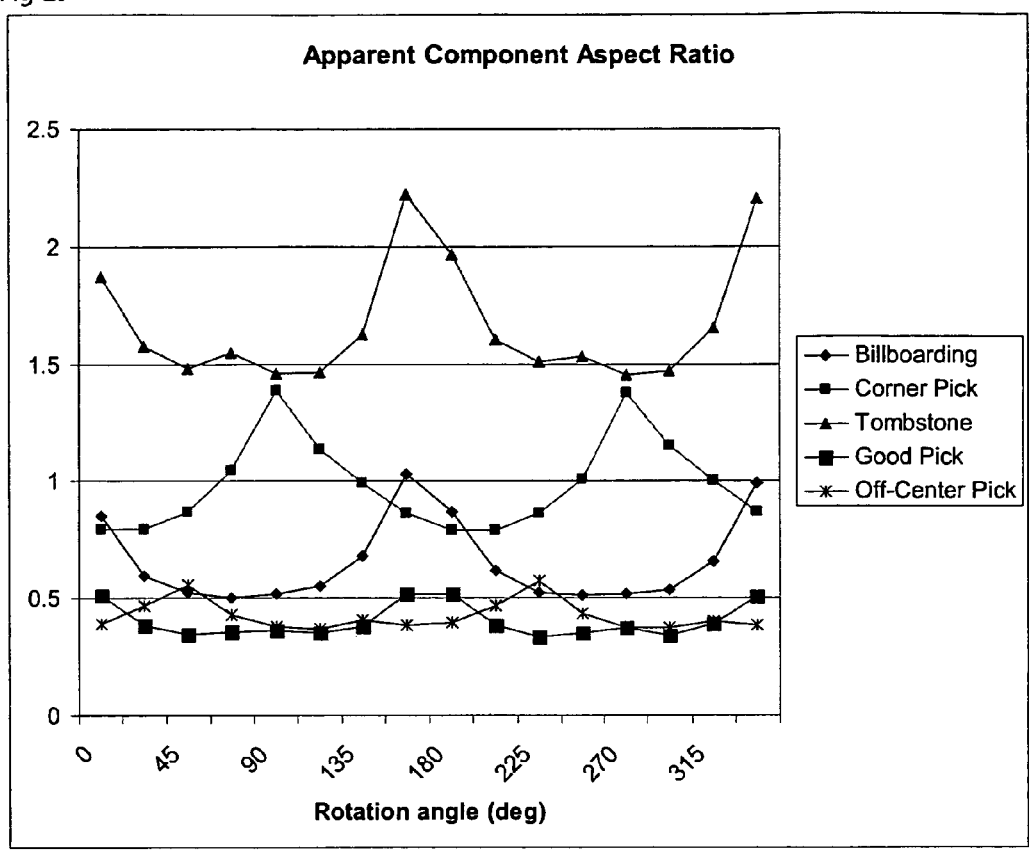

FIG. 25 is a diagrammatic view of a series of images 476, 478, 480 showing component 304 retained upon nozzle 210 in a plurality of different poses. FIG. 25 differs from FIG. 24 in that the images of FIG. 25 are focused shadow images. FIG. 25 illustrates a condition known as a corner pick where a corner of component 304 is lodged in the vacuum aperture. FIG. 25 also illustrates that in various poses, or angular ordinations, the corner picked component 304 presents drastically different profiles. Thus, as set forth above, the employment of various image analytics upon two or more successively acquired after-pick shadow images, whether focused or not, can easily provide important information with respect to the efficacy of the pick operation. FIGS. 26A, 26B and 26C illustrate various metrics such as height (H), width (W), and angle of major axis orientation (theta-$\theta$). FIGS. 27-29 illustrate various component metrics: apparent component tip; apparent relative component height; and apparent component aspect ratio; respectively, and a variety of different component poses. As evident in FIGS. 27-29, a component that has been correctly picked will exhibit the lowest variability in these variance metrics as the pose varies.

Accordingly, the variance of one or more metrics can be compared to a pre-selected threshold to simply determine whether the component has been picked effectively.

Figure 30:
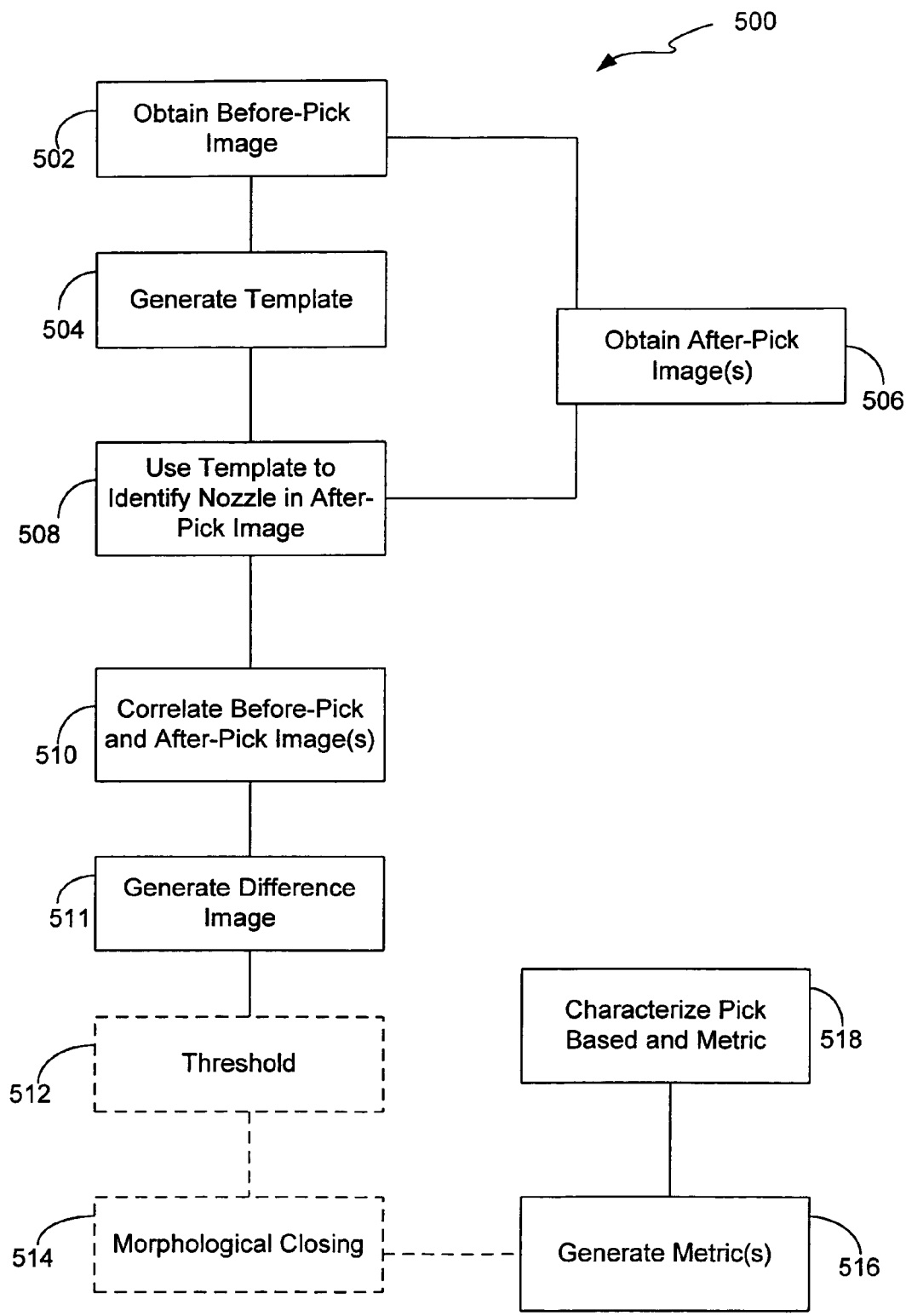
FIG. 30 is a flow diagram of a method of characterizing a pick operation of a pick and place machine in accordance with an embodiment of the present invention.

FIG. 30 is a flow diagram of a method of characterizing a pick operation of a pick and place machine in accordance with an embodiment of the present invention. Method 500 begins at block 502 where a sensor, such as sensor 205, is used to obtain a before-pick image of a nozzle of the pick and place machine. As indicated at block 504, the nozzle pattern in the before-pick image is used to generate a template. At block 506, one or more after-pick images are acquired. As indicated in FIG. 30, blocks 504 and 506 can be executed in any order, including simultaneously. Once the template is generated, it is used to identify the nozzle in the after-pick image(s), as indicated at block 508. At block 510, the before-pick image and the after-pick image(s) are correlated, preferably using an NGC-based correlation. A difference image is generated at block 511 by subtracting the before-pick image from the correlated after-pick image(s). At optional block 512 the difference image(s) are preferably thresholded using known thresholding techniques. At optional block 514, a morphological closing operation is preferably applied to the thresholded difference image. At block 514, it is also preferred that the blobs are preferably labeled using a simple region growing technique and all but the largest blob are suppressed. At block 516, one or more metrics are calculated based on the difference image. At block 518, the metrics are used to characterize the pick operation as either good or bad. Method 500 can be used for both focused shadows and non-focused shadows.

Embodiments of the present invention allow relatively simple image acquisition systems to be used with commercially available digital signal processors to provide accurate pick characterizations in real-time during operation of the pick and place machine. This results in reduced occurrence of placement of erroneously picked components, and reduction of rework required to remedy such problems.

Although the present invention has been described with reference to preferred embodiments, workers skilled in the art will recognize that changes may be made in form and detail without departing from the spirit and scope of the invention.

What is claimed is:

1. A pick and place machine comprising:
    a placement head having a nozzle for temporarily adhering a component thereto;
    a robotic system for generating relative movement between the placement head and a workpiece;
    a sensor having an illuminator disposed to direct illumination at the component, the sensor also having image acquisition system disposed to acquire a two-dimensional before-pick shadow image of the nozzle, and to acquire at least one two-dimensional after-pick shadow image of the nozzle and the component; and
    a processor adapted to process the before- and after-pick images to characterize a pick operation.

2. The pick and place machine of claim 1, wherein the before-pick shadow image is a before-pick non-focused shadow image.

3. The pick and place machine of claim 2, wherein each after-pick shadow image is a non-focused shadow image.

4. The pick and place machine of claim 1, wherein the before-pick shadow image is a focused before-pick shadow image.

5. The pick and place machine of claim 4, wherein each after-pick shadow image is a focused shadow image.

6. The pick and place machine of claim 1, wherein the sensor includes an area illuminator to back light the component.

7. The pick and place machine of claim 1, wherein the image acquisition system includes a charge-coupled device.

8. The pick and place machine of claim 1, wherein the image acquisition system includes a complementary metal oxide semiconductor device.

9. The pick and place machine of claim 1, wherein the sensor includes imaging optics.

10. The pick and place machine of claim 9, wherein the sensor includes illumination optics.

11. The pick and place machine of claim 1, wherein the sensor includes illumination optics.

12. The pick and place machine of claim 1, wherein the image acquisition system is disposed to acquire a plurality of after-pick images, each after-pick image being acquired at a different component pose.

13. The pick and place machine of claim 12, wherein characterization of the pick operation is based upon examining variance of a metric among the after-pick images.

14. A sensor for sensing a pick operation in a pick and place machine, the sensor comprising:
    an illuminator disposed to direct illumination at a component held upon a nozzle of the pick and place machine;
    an image acquisition system disposed to acquire a two-dimensional before-pick shadow image of the nozzle, and to acquire at least one two-dimensional after-pick shadow image of the nozzle and the component; and
    a processor adapted to process the before- and after-pick images to characterize a pick operation.

15. The sensor of claim 14, wherein the image acquisition system includes a charge-coupled device.

16. The sensor of claim 14, wherein the image acquisition system includes a complementary metal oxide semiconductor device.

17. The sensor of claim 14, wherein the sensor includes imaging optics disposed to image a shadow onto an area detector.

18. The sensor of claim 17, wherein the sensor includes illumination optics to decrease divergence of the illumination.

19. The sensor of claim 14, wherein the sensor includes illumination optics to decrease divergence of the illumination.

20. The sensor of claim 14, wherein the image acquisition system is disposed to acquire a plurality of after-pick images, each after-pick image being acquired at a different component pose.

21. The sensor of claim 20, wherein characterization of the pick operation is based upon examining variance of a metric among the after-pick images.

22. A method of characterizing a pick operation of a pick and place machine, the method comprising:
    obtaining a before-pick shadow image of a nozzle of the pick and place machine;
    obtaining at least one after-pick shadow image of the nozzle;
    subtracting the before-pick image from the at least one after-pick image to generate at least one difference image;
    determining at least one metric based upon the difference image; and
    characterizing the pick operation based upon the at least one metric.

23. The method of claim 22, and further comprising extracting an image of the nozzle from the before-pick image to generate a template.

24. The method of claim 23, and further comprising using the template to identify the nozzle in each after-pick image.

25. The method of claim 22, and further comprising co-registering the before-pick image with each after-pick image prior to subtracting the before-pick image from each after-pick image.

26. The method of claim 25, wherein co-registering includes utilizing a normalized gray-scale correlation.

27. The method of claim 22, and further comprising thresholding the difference image to generate a thresholded difference image.

28. The method of claim 27, and further comprising performing a morphological closing operation upon the thresholded difference image.

29. The method of claim 22, wherein obtaining at least one after-pick shadow image of the nozzle includes obtaining a plurality of after-pick images, each image acquired relative to a different pose of the component.

30. The method of claim 22, wherein all images are of non-focused shadows.

31. The method of claim 22, wherein all images are of focused shadows.

* * * * *